(12) United States Patent
Xu

(10) Patent No.: US 8,737,058 B2
(45) Date of Patent: May 27, 2014

(54) BLADE SERVER

(75) Inventor: Ji-Peng Xu, Shanghai (CN)

(73) Assignee: Inventec Corporation, Taipei (TW)

( * ) Notice: Subject to any disclaimer, the term of this patent is extended or adjusted under 35 U.S.C. 154(b) by 209 days.

(21) Appl. No.: 13/399,610

(22) Filed: Feb. 17, 2012

(65) Prior Publication Data

US 2013/0135817 A1   May 30, 2013

(30) Foreign Application Priority Data

Nov. 30, 2011   (CN) .......................... 2011 1 0391273

(51) Int. Cl.
  *G06F 1/16*   (2006.01)
(52) U.S. Cl.
  USPC .................................................... 361/679.37
(58) Field of Classification Search
  USPC .................. 361/679.37, 679.48, 724–727
  See application file for complete search history.

(56) References Cited

U.S. PATENT DOCUMENTS

| | | | |
|---|---|---|---|
| H1801 H * | 9/1999 | Browning et al. ................. 379/9 |
| 6,819,567 B2 * | 11/2004 | Baker et al. ..................... 361/724 |
| 6,957,291 B2 * | 10/2005 | Moon et al. .................... 710/302 |
| 7,236,361 B2 * | 6/2007 | Cote et al. ...................... 361/695 |
| 7,408,772 B2 * | 8/2008 | Grady et al. ............. 361/679.48 |
| 7,719,834 B2 * | 5/2010 | Miyamoto et al. ............ 361/695 |
| 7,944,700 B2 * | 5/2011 | Wang et al. .................... 361/727 |
| 7,965,502 B2 * | 6/2011 | Miyamoto et al. ........ 361/679.48 |
| 8,116,078 B2 * | 2/2012 | Xu et al. ........................ 361/695 |
| 8,335,075 B2 * | 12/2012 | Zhang ...................... 361/679.33 |
| 8,351,198 B2 * | 1/2013 | Campini et al. ......... 361/679.37 |
| 8,373,983 B2 * | 2/2013 | Zhang ...................... 361/679.33 |
| 8,422,217 B2 * | 4/2013 | Xia et al. ................. 361/679.33 |
| 8,462,495 B1 * | 6/2013 | Keefe et al. .............. 361/679.46 |
| 2006/0050487 A1 * | 3/2006 | Wu et al. ........................ 361/724 |
| 2007/0135033 A1 * | 6/2007 | Kao et al. ....................... 454/184 |
| 2008/0113607 A1 * | 5/2008 | Shih .............................. 454/233 |
| 2008/0212273 A1 * | 9/2008 | Bechtolsheim ............... 361/685 |
| 2010/0025017 A1 * | 2/2010 | Zhang et al. ............. 165/104.31 |
| 2010/0027213 A1 * | 2/2010 | Wu et al. .................. 361/679.39 |
| 2010/0271766 A1 * | 10/2010 | Lin .......................... 361/679.02 |
| 2011/0116226 A1 * | 5/2011 | Yang ........................ 361/679.48 |
| 2011/0273836 A1 * | 11/2011 | Xu et al. .................. 361/679.33 |
| 2012/0050981 A1 * | 3/2012 | Xu et al. .................. 361/679.33 |
| 2012/0113591 A1 * | 5/2012 | Chuang ........................ 361/695 |
| 2013/0077223 A1 * | 3/2013 | Xu .............................. 361/679.4 |

* cited by examiner

*Primary Examiner* — Lisa Lea Edmonds
(74) *Attorney, Agent, or Firm* — CKC & Partners Co., Ltd.

(57) ABSTRACT

A blade server includes a casing, a plurality of blade modules, and a function module. The casing has a first end and a second end being opposite to each other. The blade modules are configured on the first end of the casing, and may be moved in or moved out from the first end of the casing. Each blade module includes a first tray, a main board module, and a plurality of hard disk modules. The main board module is configured on the first tray. The hard disk modules are detachably disposed on the first tray, and are electrically connected to the main board module. The function module is configured on the second end of the casing, and may be moved in or moved out from the second end of the casing.

9 Claims, 5 Drawing Sheets

BLADE SERVER

CROSS-REFERENCE TO RELATED APPLICATION

This application claims the priority benefit of China application serial no. 201110391273.X, filed on Nov. 30, 2011. The entirety of the above-mentioned patent application is hereby incorporated by reference herein and made a part of this specification.

BACKGROUND OF THE INVENTION

1. Field of the Invention

The present invention generally relates to a server, in particular, to a blade server.

2. Description of Related Art

A server, being a core computer serving each computer in a network system, may provide disks, a printing service, and other functions required for users, and user can share resource on the network. A basic architecture of the server is approximately the same as a basic architecture of a common personal computer, and is formed by a central processing unit (CPU), a memory, and input/output (I/O) devices, and other members connected through a bus, in which the CPU and the memory are connected through a north bridge chip and the I/O devices are connected through a south bridge chip. According to a structure of a casing, the server passes through three evolution processes, which are a conventional pedestal server having a large volume and occupying the space, a rack server in which multiple hosts are placed in a cabinet for being uniformly managed, and a blade server with a thin appearance, a small occupied space, low power consumption, and being easily managed.

With development of information technology, the energy consumed by the server, the heat dissipation required by normal operation of the server device, and other costs are rapidly increased. Therefore, it is currently an important topic how to realize high density arrangement of the server and save a configuration space.

SUMMARY OF THE INVENTION

Accordingly, the present invention is directed to a blade module server, capable of saving a configuration space.

The present invention provides a blade server, which includes a casing, a plurality of blade modules, and a function module. The casing has a first end and a second end being opposite to each other. The blade modules are configured on the first end of the casing, and being moved in or moved out from the first end of the casing. Each blade module includes a first tray, a main board module, and a plurality of hard disk modules. The main board module is configured on the first tray. The hard disk modules are detachably disposed on the first tray, and are electrically connected to the main board module. The function module is configured on the second end of the casing, and may be moved in or moved out from the second end of the casing.

In an embodiment of the present invention, each hard disk module includes a transfer board, a second tray, and at least one hard disk. The transfer board is electrically connected to the main board module. The second tray is detachably disposed on the first tray. The hard disk is disposed on the second tray, and is electrically connected to the transfer board.

In an embodiment of the present invention, the second tray may be moved in or moved out from the first end of the casing.

In an embodiment of the present invention, the blade module further includes a hard disk backplane, the main board module is placed on one side of the hard disk backplane, the hard disk modules are placed on the other side of the hard disk backplane, and the main board module and the hard disk modules are electrically connected to the hard disk backplane.

In an embodiment of the present invention, the main board module has a connector, electrically connected to the hard disk backplane.

In an embodiment of the present invention, the function module is a switch module.

In an embodiment of the present invention, the blade server further includes a backplane, configured on the second end of the casing, the blade module is placed on one side of the backplane and is electrically connected to the backplane.

In an embodiment of the present invention, the blade server further includes a plurality of power modules, placed on the other side of the backplane and electrically connected to the backplane, in which the power modules are mutually redundant.

In an embodiment of the present invention, the blade server further includes a plurality of fans, configured on the second end of the casing, electrically connected to the backplane, and being mutually redundant.

In an embodiment of the present invention, the function module is electrically connected to the backplane, and each blade module exchanges data through the function module.

Based on the above mentioned, a blade module and a function module of the present invention are respectively configured on a first end and a second end being opposite to each other of a casing, the blade module may be moved in or moved out from the first end, and the function module may be moved in or moved out from the second end, so that when the blade module and the function module are maintained or replaced, it is not necessary to open an upper cover of the casing, so that maintaining of the blade server is more convenient. In addition, in the blade module, a main board module and a hard disk module are configured on a first tray, the hard disk module and the main board module are electrically connected, and the hard disk module may be detached from the first tray, so that the main board module and the hard disk module are configured in a high density manner, thereby saving a configuration space of the blade module.

In order to make the aforementioned features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
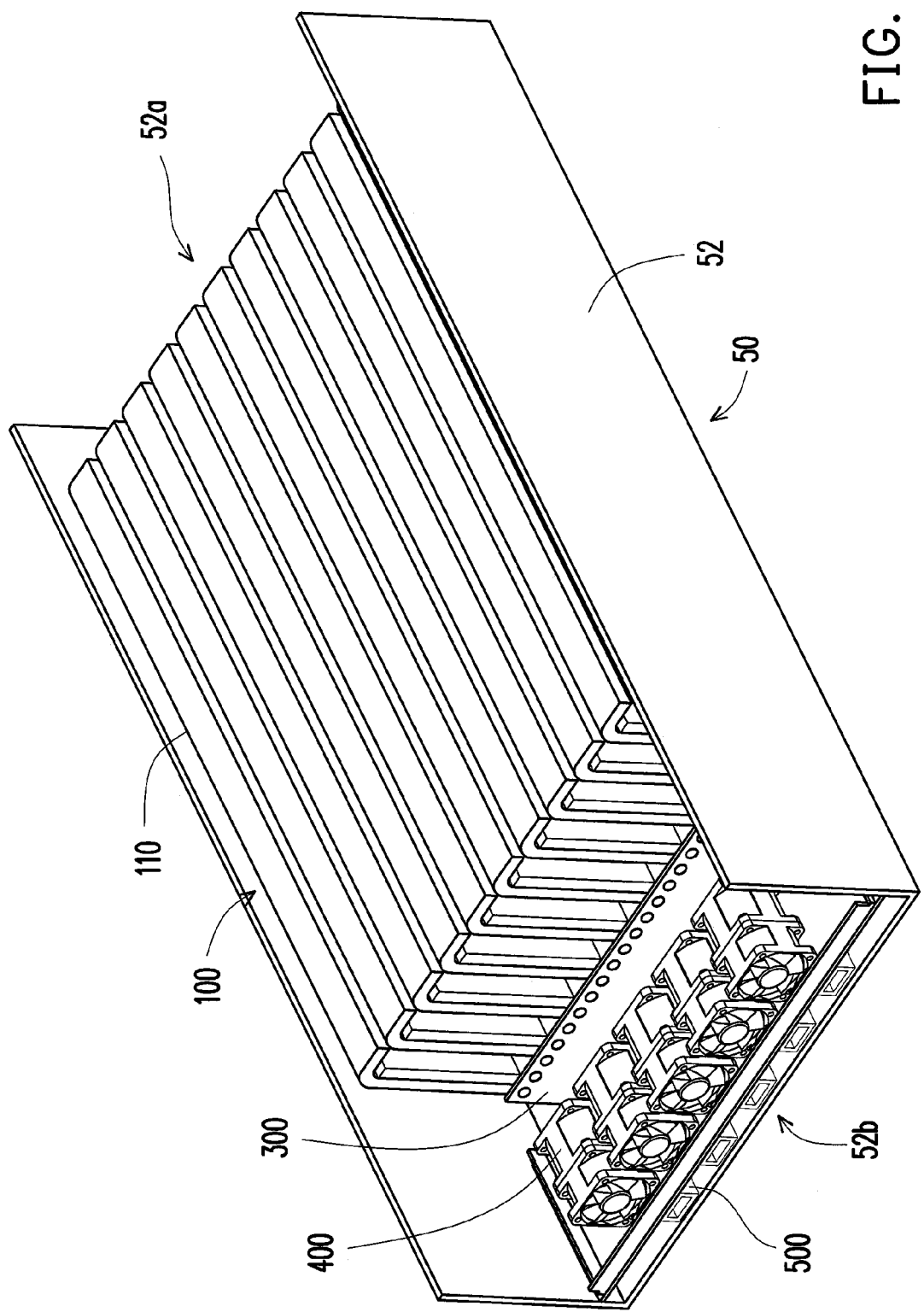
FIG. 1 is a three-dimensional view of a blade server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
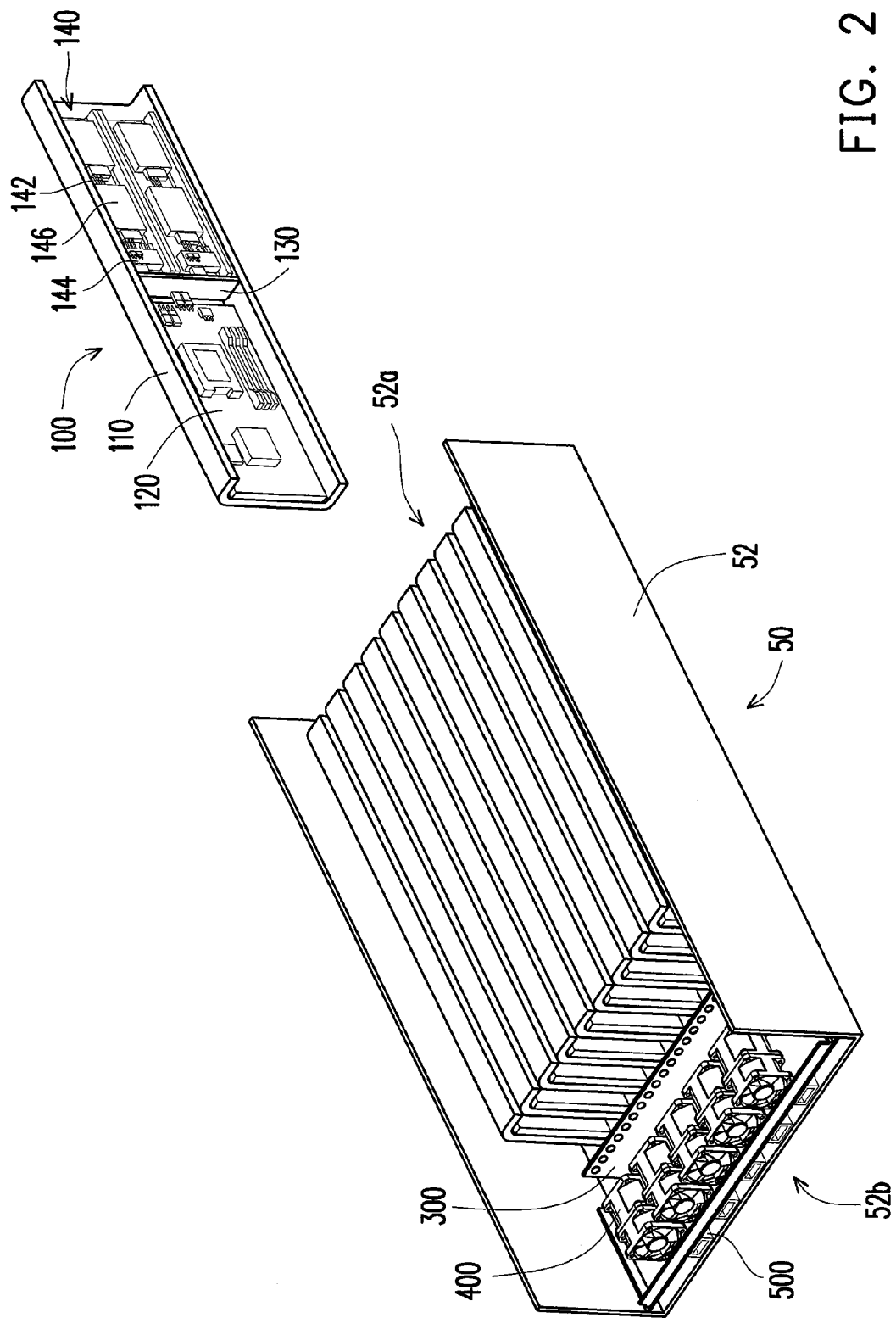
FIG. 2 is a schematic view of separating the blade module of FIG. 1 from a casing.
Figure 3:
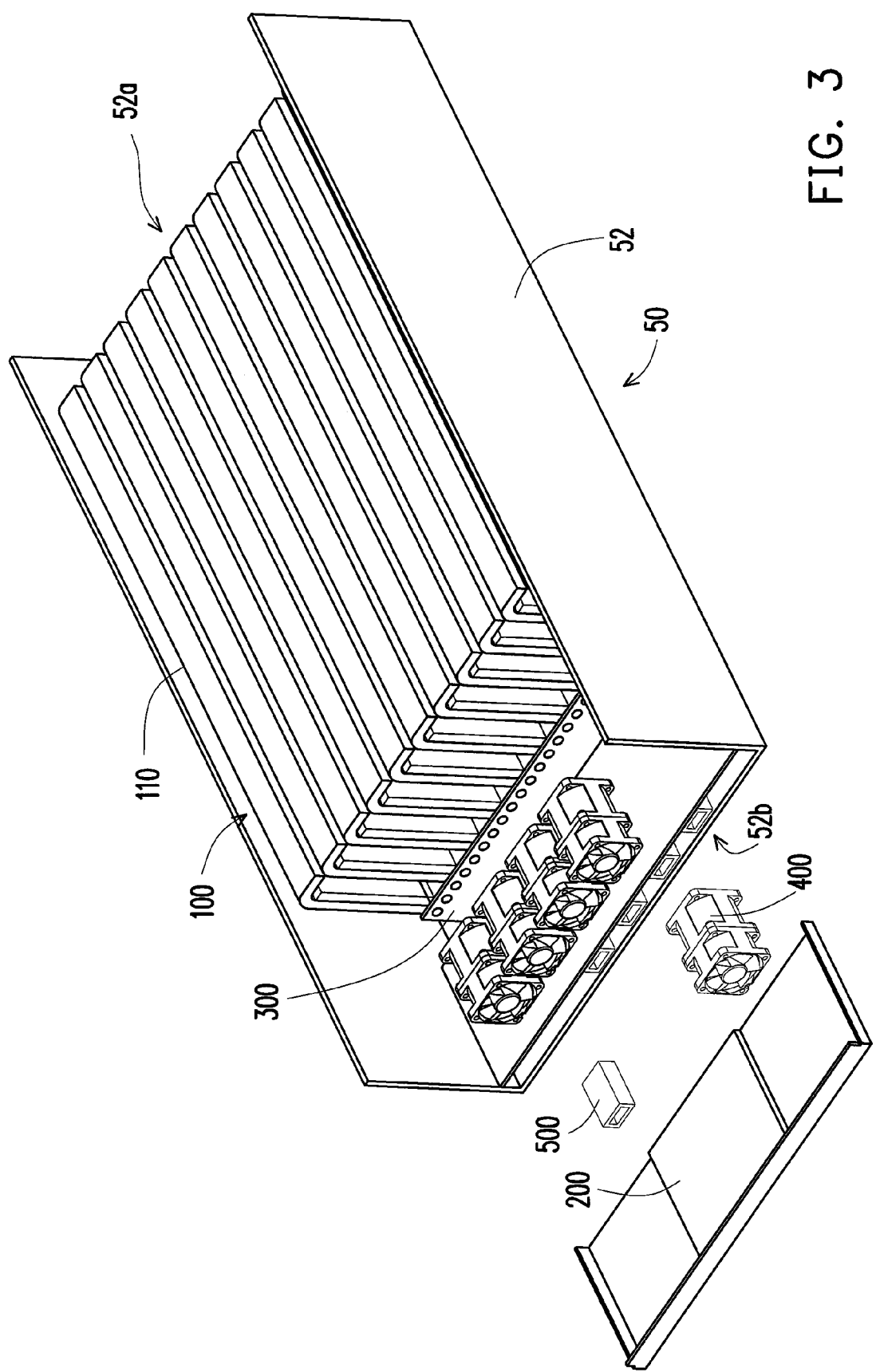
FIG. 3 is an exploded view of the blade server of FIG. 1.

FIG. 1 is a three-dimensional view of a blade server according to an embodiment of the present invention, FIG. 2 is a schematic view of separating the blade module of FIG. 1 from a casing, and FIG. 3 is an exploded view of the blade server of FIG. 1. Referring to FIG. 1 to FIG. 3, the blade server 50 of this embodiment includes a casing 52, a plurality of blade modules 100, and a function module 200. The casing 52 has a first end 52a and a second end 52b being opposite to each other. The blade modules 100 are configured on the first end 52a of the casing 52, and may be moved in (as shown in FIG. 1) or moved out (as shown in FIG. 2) from the first end 52 of the casing 52. Each blade module 100 includes a first tray 110, a main board module 120, and a plurality of hard disk modules 140 (two hard disk modules are shown). The main board module 120 is configured on the first tray 110. The hard disk modules 140 are detachably disposed on the first tray 110, and are electrically connected to the main board module 120. The function module 200 is configured on the second end 52b of the casing 52, and may be moved in (as shown in FIG. 1) or moved out (as shown in FIG. 3) from the second end 52b of the casing 52.

Under the above configuration manner, the blade module 100 and the function module 200 are respectively configured on the first end 52a and the second end 52b being opposite to each other of the casing 52, the blade module 100 may be moved in or moved out from the first end 52a, and the function module 200 may be moved in or moved out from the second end 52b, so that when the blade module 100 and the function module 200 are maintained or replaced, it is not necessary to open an upper cover (not shown) of the casing 52, so that maintaining of the blade server 50 is more convenient. In addition, in the blade module 100, the main board module 120 and the hard disk module 140 are configured on the first tray 110, the hard disk module 140 and the main board module 120 are electrically connected, and the hard disk module 140 may be detached from the first tray 110, so that the main board module 120 and the hard disk module 140 are configured in a high density manner, thereby saving a configuration space of the blade module 100.

Figure 4:
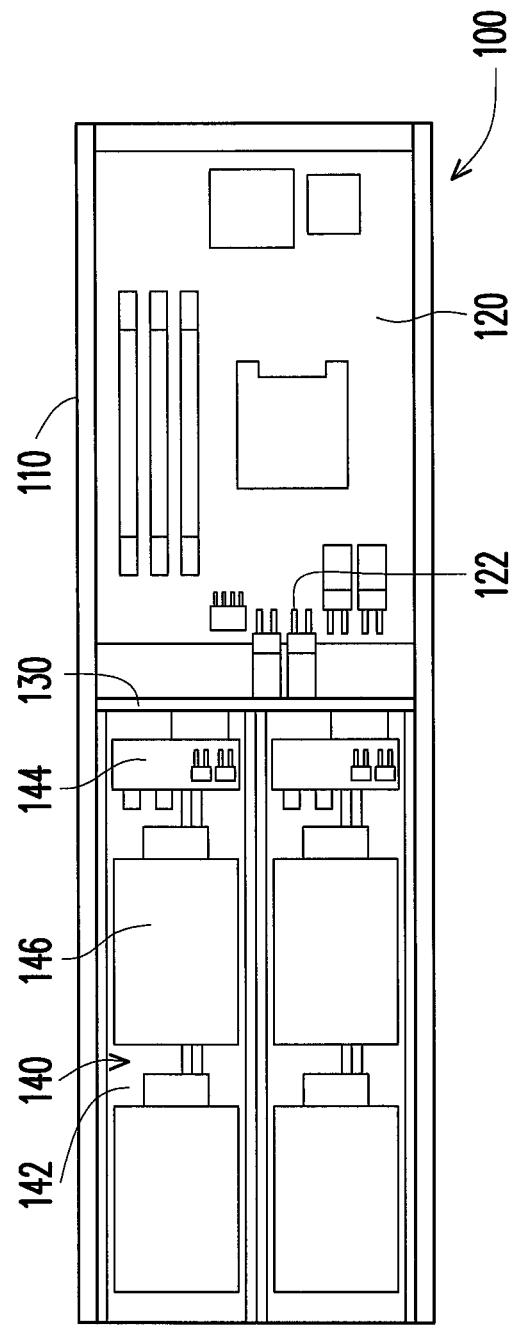
FIG. 4 is a top view of the blade module of FIG. 2.

FIG. 4 is a top view of the blade module of FIG. 2. Referring to FIG. 2 and FIG. 4, in detail, each hard disk module 140 of this embodiment includes a transfer board 144, a second tray 142, and at least one hard disk 146 (two hard disks are shown), the transfer board 144 is electrically connected to the main board module 120, the second tray 142 is detachably disposed on the first tray 110, and the hard disk 146 is disposed on the second tray 142 and is electrically connected to the transfer board 144. Further, the blade module 100 of this embodiment further includes a hard disk backplane 130, the main board module 120 is placed on one side of the hard disk backplane 130, the hard disk modules 140 are placed on the other side of the hard disk backplane 130, the main board module 120 has a connector 122 and is electrically connected to the hard disk backplane 130 through the connector 122, and the hard disk modules 140 are electrically connected to the hard disk backplane 130 through the transfer board 144.

Referring to FIG. 3, in this embodiment, the blade server 50 further includes a backplane 300, the backplane 300 is configured on the second end 52b of the casing 52, and the blade module 100 is placed on one side of the backplane 300 and is electrically connected to the backplane 300. The function module 200 is, for example, a switch module and is electrically connected to the backplane 300, and each blade module 100 is suitable for being electrically connected to the function module 200 through the backplane 300, so as to exchange data through the function module 200.

The blade server 50 of this embodiment further includes a plurality of fans 400, the fans 400 are configured on the second end 52b of the casing 52 and are electrically connected to the backplane 300, in which the fans 400 are mutually redundant, so that operation of the blade server 50 is more stable. In addition, the blade server 50 further includes a plurality of power modules 500, the power modules 500 are placed on the other side of the backplane 300 and are electrically connected to the backplane 300, so that electric power is transferred to the blade module 100, the function module 200, and the fan 400 through the backplane 300. The power modules 500 are mutually redundant, so that the operation of the blade server 50 is more stable.

Figure 5:
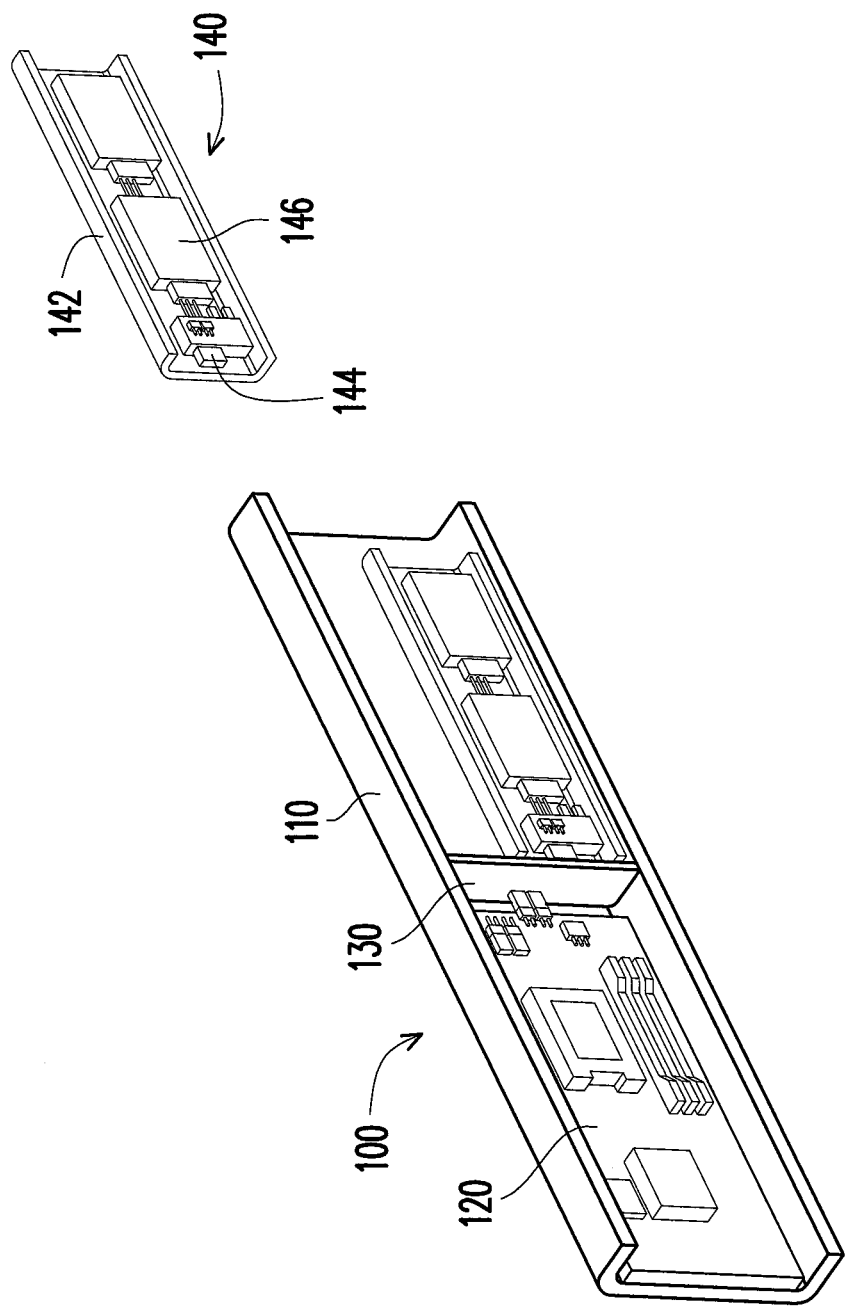
FIG. 5 is a schematic view in which a second tray of FIG. 2 is detached.

FIG. 5 is a schematic view in which a second tray of FIG. 2 is detached. Referring to FIG. 5, in this embodiment, the second tray 142 may be separated from the first ray 110, so as to be moved in or moved out from the first end 52a of the casing 52 as shown in FIG. 1.

To sum up, a blade module and a function module of the present invention are respectively configured on a first end and a second end being opposite to each other of a casing, the blade module may be moved in or moved out from the first end, and the function module may be moved in or moved out from the second end, so that when the blade module and the function module are maintained or replaced, it is not necessary to open an upper cover of the casing, so that maintaining of the blade server is more convenient. In addition, in the blade module, a main board module and a hard disk module are configured on a first tray, the hard disk module and the main board module are electrically connected, and the hard disk module may be detached from the first tray, so that the main board module and the hard disk module are configured in a high density manner, thereby saving a configuration space of the blade module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A blade server, comprising:
a casing, comprising a first end and a second end being opposite to each other;
a plurality of blade modules, configured on the first end of the casing, being moved in or moved out from the first end of the casing, and each blade module comprising:
a first tray;
a main board module, configured on the first tray; and
a plurality of hard disk modules, detachably disposed on the first tray, and electrically connected to the main board module, and each of the hard disk modules comprising:
a transfer board, electrically connected to the main board module;
a second tray, detachably disposed on the first tray; and
at least one hard disk, disposed on the second tray, and electrically connected to the transfer board; and
a function module, configured on the second end of the casing, being moved in or moved out from the second end of the casing.

2. The blade server according to claim 1, wherein the second tray is moved in or moved out from the first end of the casing.

3. The blade server according to claim 1, wherein the blade module further comprises a hard disk backplane, the main board module is placed on one side of the hard disk backplane, the hard disk modules are placed on the other side of the hard disk backplane, and the main board module and the hard disk modules are electrically connected to the hard disk backplane.

4. The blade server according to claim 3, wherein the main board module comprises a connector, electrically connected to the hard disk backplane.

5. The blade server according to claim 1, wherein the function module is a switch module.

6. The blade server according to claim 1, further comprising a backplane, configured on the second end of the casing, wherein the blade module is placed on one side of the backplane and is electrically connected to the backplane.

7. The blade server according to claim 6, further comprising a plurality of power modules, placed on the other side of the backplane and electrically connected to the backplane, wherein the power modules are mutually redundant.

8. The blade server according to claim 6, further comprising:
 a plurality of fans, configured on the second end of the casing, electrically connected to the backplane, and being mutually redundant.

9. The blade server according to claim 6, wherein the function module is electrically connected to the backplane, and each of the blade modules exchanges data through the function module.

* * * * *